United States Patent [19]
Schaumont et al.

[11] Patent Number: 5,801,780
[45] Date of Patent: Sep. 1, 1998

[54] METHOD AND A DEVICE FOR CONVERTING A PICTURE

[75] Inventors: Jan Schaumont, Kortrijk; Patrick Candry, Kuurne, both of Belgium

[73] Assignee: Barco, Poperinge, Belgium

[21] Appl. No.: 556,994

[22] PCT Filed: Jun. 10, 1994

[86] PCT No.: PCT/BE94/00039

§ 371 Date: Feb. 8, 1996

§ 102(e) Date: Feb. 8, 1996

[87] PCT Pub. No.: WO95/01047

PCT Pub. Date: Jan. 5, 1995

[30] Foreign Application Priority Data

Jun. 10, 1993 [BE] Belgium ................... 09300587

[51] Int. Cl.⁶ ............... H04N 7/01; H04N 1/393
[52] U.S. Cl. ........................... 348/441; 358/451
[58] Field of Search ..................... 348/441, 443, 348/445, 446, 448, 451, 452, 458, 459, 561, 562; 358/451, 452; H04N 7/00, 11/00

[56] References Cited

U.S. PATENT DOCUMENTS 4,423,520  12/1983  Murayama et al. .
4,893,319  1/1990   Ziuchkovski .
4,933,775  6/1990   Shimura .
5,400,051  3/1995   Krueger, Jr. .

FOREIGN PATENT DOCUMENTS

| 0218406 | 4/1987 | European Pat. Off. . |
|---|---|---|
| 0361947 | 4/1990 | European Pat. Off. . |
| 0389164 | 9/1990 | European Pat. Off. . |
| 0392576 | 10/1990 | European Pat. Off. . |
| 0449210 | 10/1991 | European Pat. Off. . |
| 0470313 | 2/1992 | European Pat. Off. . |
| 0525527 | 2/1993 | European Pat. Off. . |
| 2656484 | 6/1991 | France . |
| 5014731 | 1/1993 | Japan . |
| BE9400039 | 10/1994 | WIPO . |

*Primary Examiner*—Michael Lee

[57] ABSTRACT

A method and a device for converting a first picture composed of M pixels towards a second substantially identical picture composed of L pixels (M∈N, L∈N, M≠L) which are destined for pixelwise representation, wherein each $K^{th}$ first pixel value is weighed with a weight factor $h(k,i)$ determined by means of projection of the second picture on the first picture and wherein before the second pixel value $y(i)$ is determined a first transfer function component (T) is added to each $k^{th}$ first pixel value and after determining the second pixel value $y(i)$ a second transfer component (T') is added to that pixel value.

22 Claims, 7 Drawing Sheets

OT1
  OT2
  OT3
  OT4

METHOD AND A DEVICE FOR CONVERTING A PICTURE

The invention relates to a method for converting a first picture composed of M pixels into a second picture composed of L pixels (M∈N, L∈N, M≠L) which second picture has a content corresponding with the first picture and which is destined to be displayed with an electronically controlled display unit provided for a pixelwise display, wherein for each $j^{th}$ ($0 \leq j \leq M-1$) pixel from the first picture a first pixel value $x(j)$ is supplied by a picture generator and for each $i^{th}$ ($0 \leq i \leq L-1$) pixel from the second picture a second pixel value $y(i)$ is determined by a summation of k first pixel values which contributes to that $i^{th}$ second pixel value, and wherein the surface of the first respectively second image is divided into M respectively L picture segments wherein a $k^{th}$ respectively $i^{th}$ pixel segment represents the surface of a $k^{th}$ first respectively $i^{th}$ second pixel and the surface of the $k^{th}$ first and $i^{th}$ second pixel differ from one another; and wherein for determining the $i^{th}$ second pixel value $y(i)$ the $i^{th}$ pixel segment is projected in the first picture on a location corresponding for that $i^{th}$ segment and as k first pixel values those k first picture segments are selected which are situated at least partially within the the surface generated by projection of that $i_{th}$ picture segment, and wherein said summation each $k^{th}$ first pixel value is weighed with a weight factor h(k, i) representing that part of the surface of the $i^{th}$ picture segment that is occupied by the $k^{th}$ picture segment.

Such a method is known from the U.S. Pat. No. 4,933,775. The picture is built up from pixels which are preferably linewise aligned. The first picture is generated by a picture generator which is for example formed by a memory. For each $j^{th}$ pixel from the first picture the picture generator supplies a first pixel value $x(j)$. That pixel value is for example formed by a digital r-bits word (r∈N) representing the content of the $j^{th}$ pixel. In order to determine an $i^{th}$ pixel from the second picture to be formed by means of a summation of first pixel value, weight factors h(k, i) are each time determined. The weight factors are determined by means of surface projection enabling to assign a dimension to the pixel. The weight factor thus gives an accurate image of the degree according to which the projected second pixel overlaps one or more first pixels. When a change of dimension of the pixel occurs upon conversion the weight factor will comprise that change.

A drawback of the known method is that the conversion does not sufficiently take into account non-linearities in the picture signal and the display unit. A transfer function is added to the picture signal in order to convert a video input voltage into luminance. That transfer function is non-linear, whilst in order to maintain the picture energy upon conversion, a linear behaviour is required. In the known method the conversion is realized on the pixels with a pixel value $x(j)$ wherein the non-linear transfer function is involved. This can lead to intensity shifts in the second pixel value which on their turn will lead to a reduced picture quality of the conversed picture with respect to the original picture.

It is an object of the invention to provide a method and a device for converting pixel values wherein the non-linear behaviour of the transfer function applied to the pixel values is taken into account.

A method according to the invention is therefor characterized in that the surface of each $i^{th}$ picture segment is multiplied with a sharpness factor (w) before the $i^{th}$ picture segment is projected on the first picture, and in that before the second pixel value $y(i)$ is determined a first transfer function component (T) is added to each of the $k^{th}$ first pixel values, and in that after determination of the second pixel value $y(i)$ a second transfer function component (T') is added to the latter.

The multiplication with a sharpness factor enables to variegate the surface of the $i^{th}$ second picture segment. Consequently different filter types can be implemented without having a negative influence on the linear behaviour of the projection itself. The multiplication with a sharpness factor thus offers the possibility to abandon the rigid division in L pixels. By thereupon using a first and a second transfer function it is possible to discard from the conversion operation non-linearities introduced by the transfer function. The addition of the second transfer function component to the second pixel values enables to add to that second pixel value the transfer function belonging to the display unit on which the second picture will be displayed. The addition of the first transfer function component to the first pixel value enables to discard the transfer function component which is present on the first pixel value and so doing to remove the non-linearities from those first pixel values. The conversion itself is thus applied on pixel values from which the non-linear behaviour has been removed. The combination of the first and second transfer function with the converting by means of surface projection, offers the advantage that the effects of the transfer function added to the first pixel values can no longer adversely affect the calculation of the second pixel values, because the first transfer functions enables to discard those effects. Said combination further attends to a correct determination and display as well as a correct manipulation of the luminance in the second picture.

A first preferred embodiment of a method according to the invention is characterized in that by conversion to a lesser amount of pixels (M>L) in the second picture with respect to the first picture said second pixel value $y(i)$ is determined by:

$$y(i) = \sum_{n=0}^{s-1} h(k,i) \times (k) \text{ with } k = \left[ \frac{i \cdot M - (W - M)/2}{L} \right] + n \text{ and } h(k,i) =$$

$$\frac{(\min(L \cdot (k+1), M \cdot (i+1) + (W-M)/2) - \max(L \cdot k, M \cdot i - (W-M)/2))}{W}$$

and if h(k, i)<0 than that value is substituted by h(k, i)=0, and wherein W=wL and the sharpness factor w≠1.

The projection of the second picture segments can thus be realised in a mathematical way and thus in a way that is electronically realizable. When W=M/L then (W−M)=0 and the later contribution falls through, enabling a more simplified implementation for that particular case.

For a conversion towards a larger number of pixels claim 3 provides a method which has analogous advantages to the one described herebefore.

It is advantageous that in the first and second picture the pixels are linewise aligned and that, by a one-dimensional conversion for each $p^{th}$ line from the second picture, a set of q equations is formed, wherein q represents the number of pixels per line and wherein each time a same weight factor is attributed per set to the pixel values of the first picture belonging to a same line in that first picture. This simplifies the calculation and calculation time is spared, enabling a real time calculation w $i^{th}$ out expensive or heavy calculation capacity.

With a second preferred embodiment of a method according to the invention, the first picture value is determined from a picture information signal having a picture content and a synchronisation component, and wherein a phased locked loop (PLL) is used to derive a pixel clock from said synchronisation component. Such a method is characterized in that a first phase signal is associated to the picture content component which first phase signal is compared with a second phase signal belonging to the pixel clock and therefrom a phase different signal is determined, which phase different signal is used as a control signal to adjust the phase of the pixel clock with respect to the first phase signal.

In this manner it is possible to accurately adjust the pixel clock in phase with the picture and to obtain in such a manner an accurate sampling of the picture enabling to improve considerably the determination of the first pixel value and the determination of the second picture values thereof.

Preferably a high frequency signal is extracted from the picture content component and said first phase being associated with that high frequency signal. The phase to be associated to the video picture can this way be accurately determined.

Advantageously a pulse shaped signal is derived from the pixel clock, the pulse width of said pulse shaped signal being equal to the period of the pixel clock, and the intensity being substantially half of the intensity of the pixel clock signal, which phase difference signal is determined by substracting said pulse shaped control signal from the first phase signal. In this way the adjustment of the loon can be realised for different frequencies or the pixel clock.

A third preferred embodiment of a method according to the invention is characterized in that a series of numbers is selected wherein each number from said series represents each time a possible number of pixels per pixel line of the first picture and wherein for each number of said series the phase locked loop is each time set with that number and within a predetermined period the phase of the pixel clock is continuously modified between two predetermined values and wherein it is checked to which extent, for the predetermined number, the phase difference signal follows the modification of the phase of the pixel clock and for said extent, an evolution value being each time determined, and wherein thereafter that number from said series for which the evolution value is the largest is selected, and wherein the loop is adjusted on the latter number. This enables an automatic adjustment of the number of pixels per pixel line.

An alternative embodiment for determining the exactitude of the number of pixels adjusted per picture line is characterized in that a first and a second set of first predetermined pixel values is formed by sampling the pixels with a first pixel clock and a second pixel clock, wherein the second pixel clock is phase shifted with respect to the first pixel clock, and wherein the first and the second set of first pixel values are reciprocally checked with one another in order to detect mutual difference in both sets and to verify whether those mutual differences show a perioodic character, and wherein by establishing such a perioodic character said mutual difference being applied to correct the preset number of pixels per line. By determining the mutual differences by determination of a periodical character, a reliable method for detecting the difference between the real number of pictures per line and this adjusted number is obtained. A better operation of the conversion means is thus obtained.

The invention also relates to a device for the application of the method.

The invention will now be described by means of the drawing representing a preferred embodiment. In the drawing.

Figure 4:
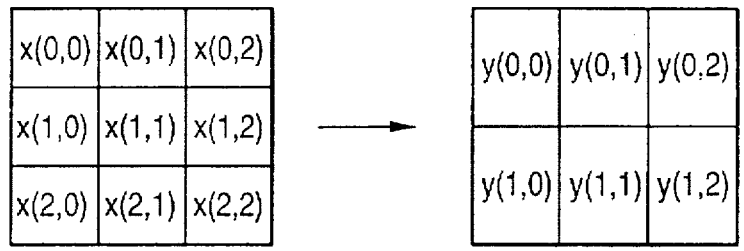
Figure 6:
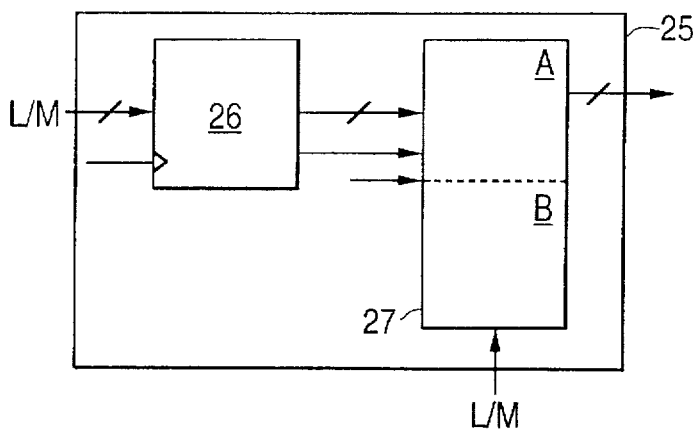
Figure 7:
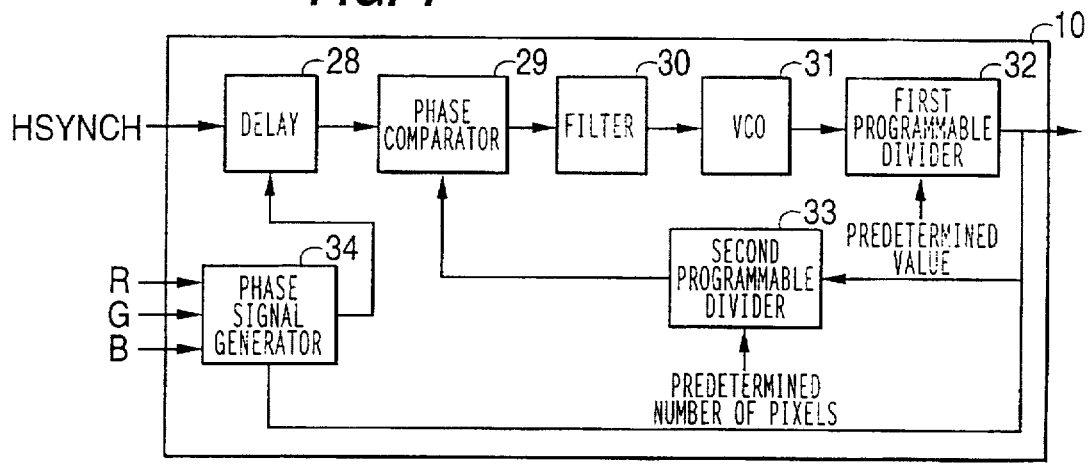
Figure 8:
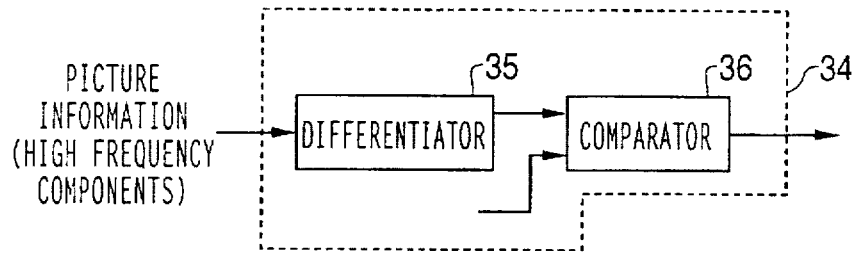
Figure 9A:
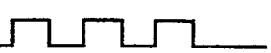
Figure 9B:
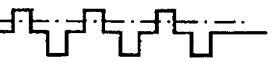
Figure 9C:
Figure 10:
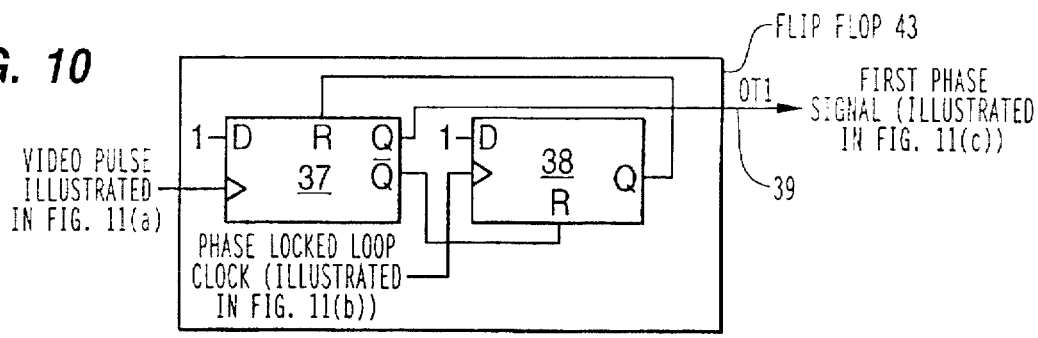
Figure 12:
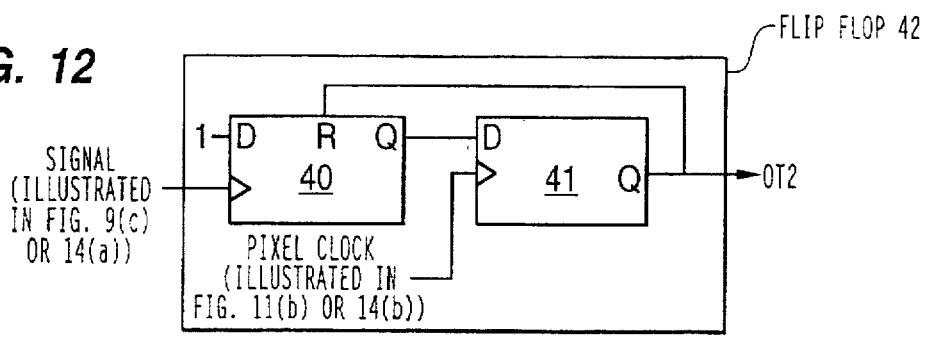
Figure 13:
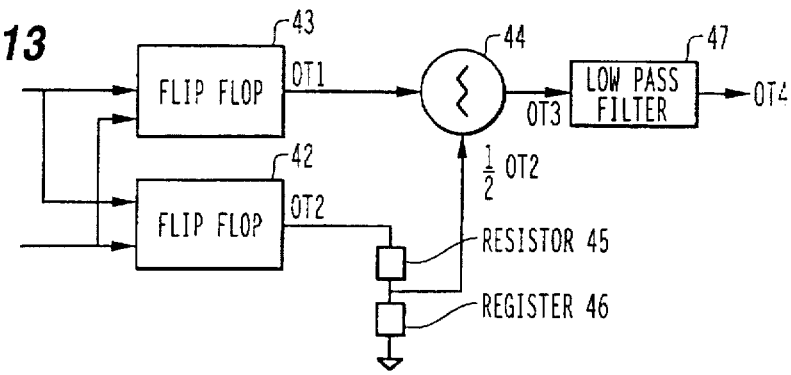
Figure 11A:
Figure 11B:
Figure 11C:
Figure 15:
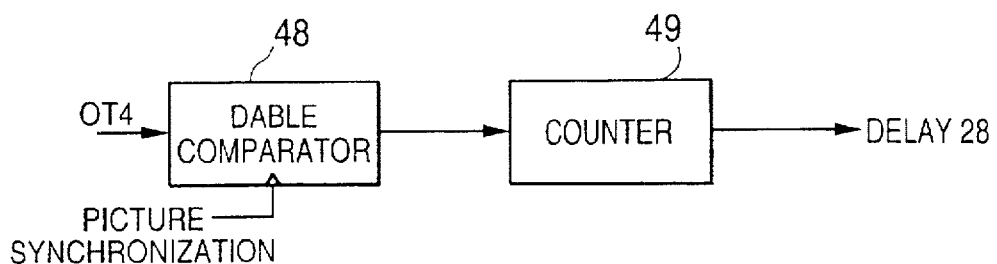
Figure 16:
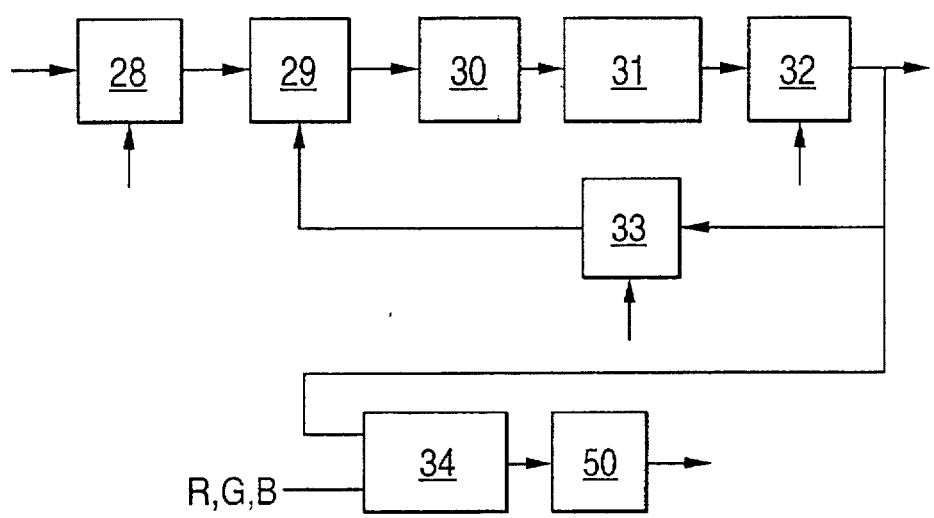
Figure 17:
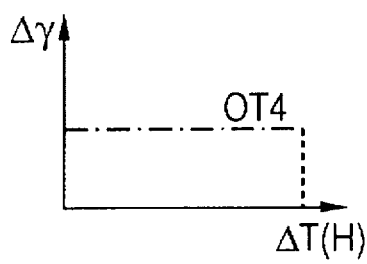
Figures 21, 23:
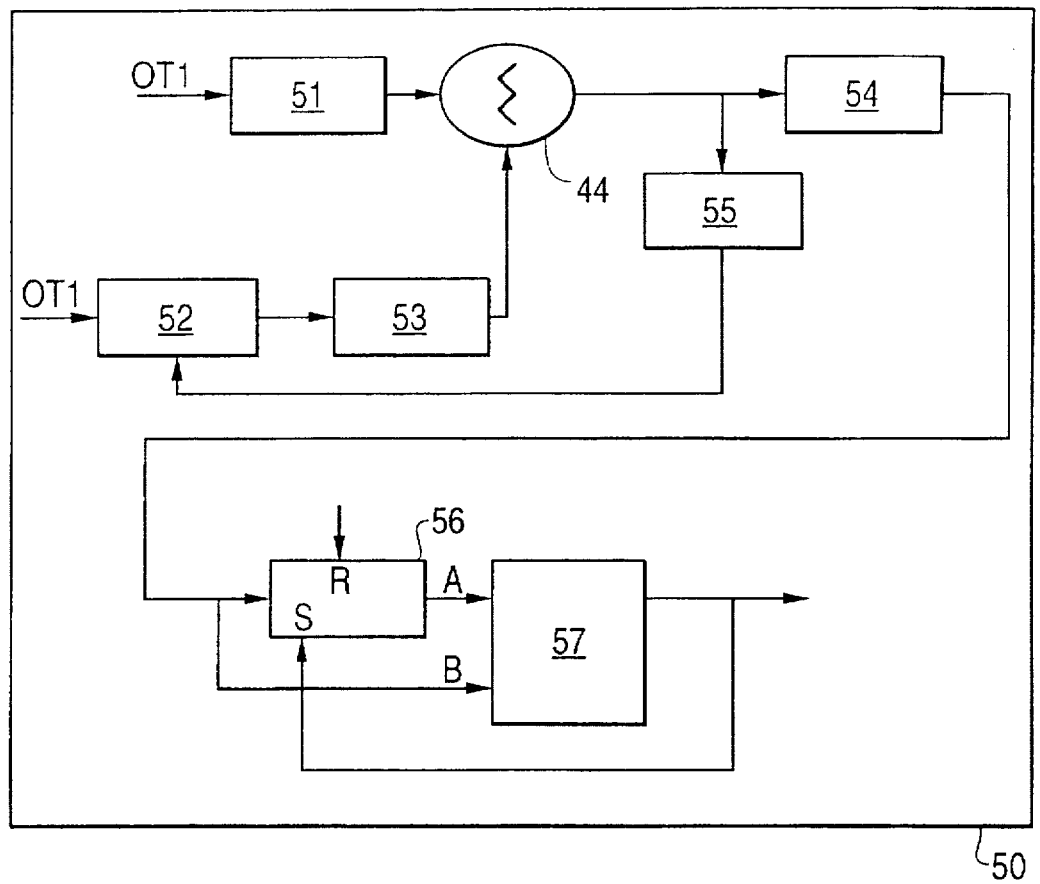
Figure 22A:
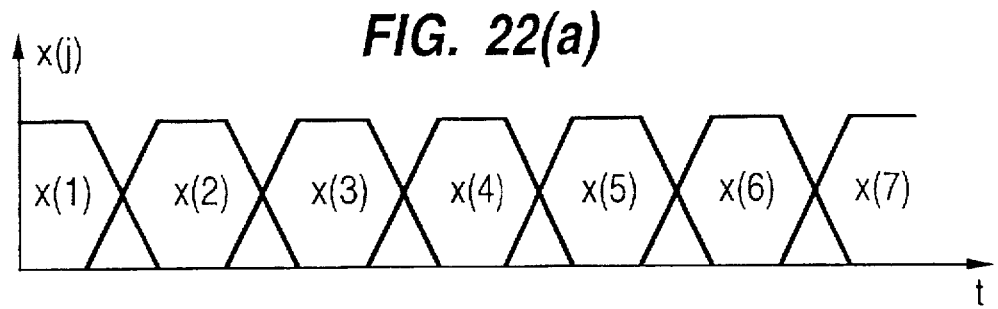
Figure 22B:
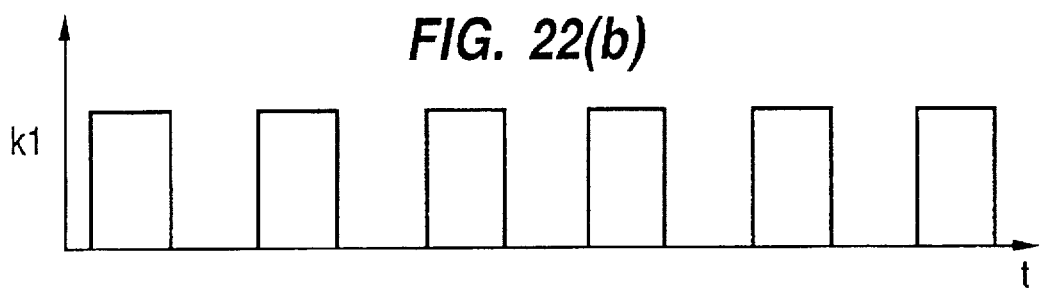
Figure 22C:
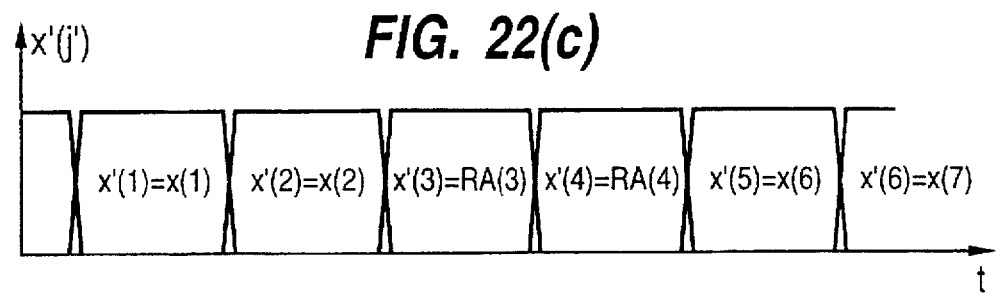
Figure 22D:
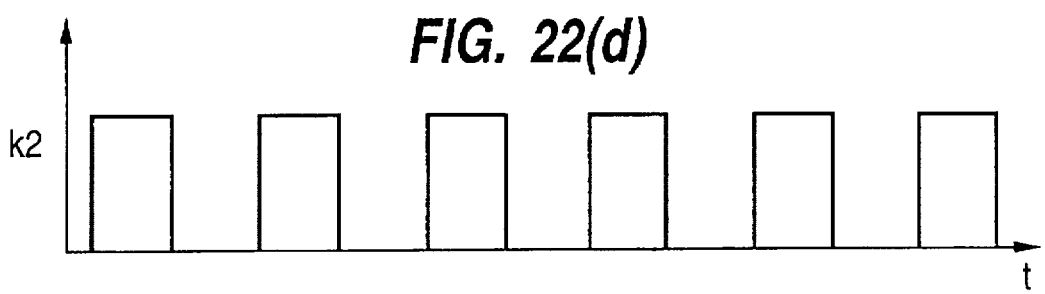
Figure 22E:
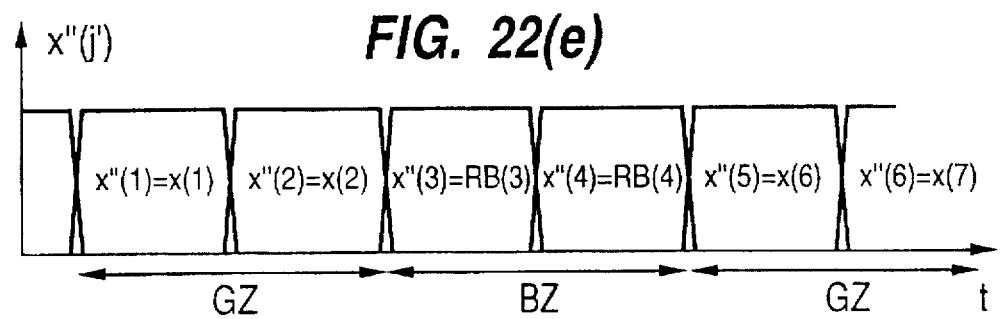
Figure 24A:
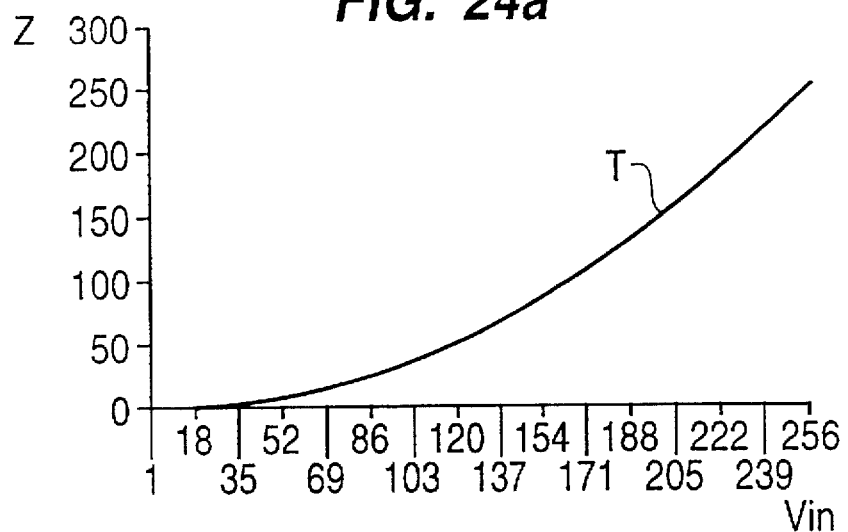
Figure 24B:
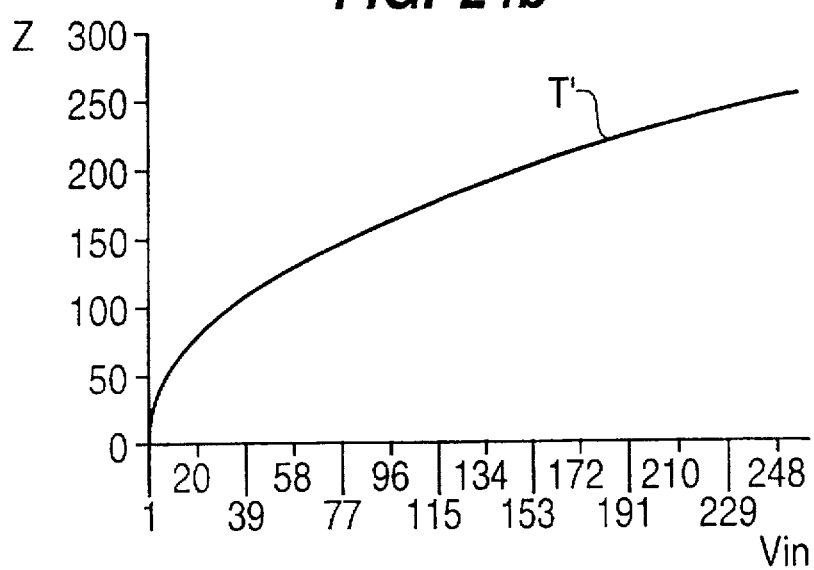

FIG. 4 respectively 5 shows an illustration of a conversion from M towards L pixels wherein M>L, M<L;

FIG. 6 shows a hardware implementation of a calculation member destined for determining the weight factors;

FIG. 7 shows a block scheme of a phase locked loop which is part of the conversion device;

FIG. 8 shows a block scheme of video phase signal generator which is part of the loop shown in FIG. 7;

FIGS. 9(a), 9(b) and 9(c) show the signals as presented to and generated by the video phase signal generator;

FIG. 10 shows a block scheme of a phase difference generator which is part of the loop shown in FIG. 7;

FIGS. 11(a), 11(b) and 11(c) show the signals such as presented to and generated by the phase difference signal generator;

FIG. 12 shows a pulse width generator which is also part of the loop as shown in FIG. 7;

FIG. 13 shows a block scheme of a modified phase signal generator which is part of the loop shown in FIG. 7;

FIGS. 14(a), 14(b), 14(c), 14(d), 14(e), 14(f) and 14(g) show the signals such as supplied to and generated by the phase difference signal generator shown in FIG. 13;

FIG. 15 shows a further part of the loop shown in FIG. 7;

FIG. 16 shows an alternative embodiment of a phase locked loop being part of the conversion device according to the invention;

FIG. 17 respectively 18, 19 and 20 shows the signals which illustrate the operation of the alternative embodiment shown in FIG. 16;

FIG. 21 shows a more detailed block scheme of the detector 50 shown in FIG. 16;

FIG. 22 shows an illustration of how an erroneous pixel clock can lead to erroneous sampling and how the latter is recognizable;

FIG. 23 shows a picture format that is used for the determination of the number of pixels by making use of the conversion calculation member;

FIGS. 24a and 24b show an embodiment of the first respectively second transfer function.

In the drawing a same reference number has been attributed to a same or analogous element.

Figure 1:
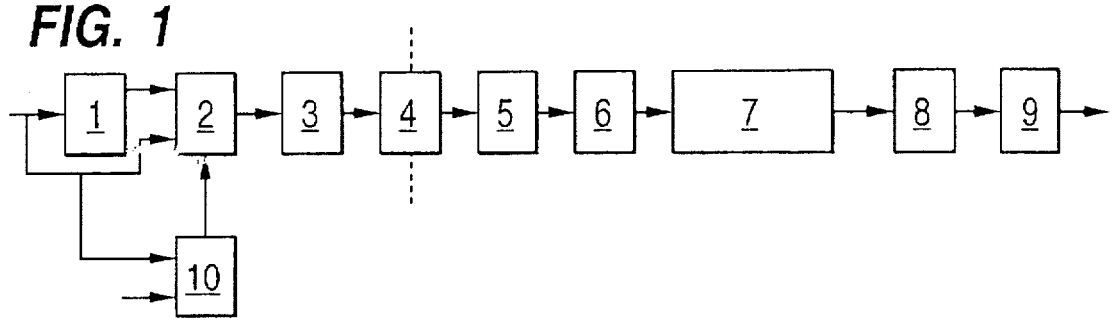
FIG. 1 shows a block scheme of an embodiment of a conversion device according to the invention.

The conversion device according to the invention and whereof FIG. 1 shows an embodiment, is destined to convert a supplied first picture comprising M(M∈N) pixels into a second picture comprising L(L∈N) pixels. The first picture is supplied by a picture generator (not shown in the figure) which is for example formed by a memory, a video recorder, a PC or a transmission central for television pictures. The conversion device is preferably destined for converting the first picture towards the second in real time. It is necessary to notice that the content of the picture remains unchanged. When the transmission velocity of the incoming picture is higher than the processing speed of the device, processing in real time is impossible. In order to take into account the speed difference the incoming picture is buffered.

The fact that the picture comprises M or L pixels does not necessarily mean that all the pixels belonging to the picture are considered. It concerns those M and respectively L pixels of the first respectively second picture which play a role upon the conversion. It is thus for example possible that upon enlarging a first picture which comprises for example a total amount of 1000 pixels only M=100 pixels are considered because those 100 pixels belong to the part to be enlarged. Upon reducing the first picture an analogous explanation is also valid.

Such a conversion unit is for example used to convert a first picture displayed on a first type of display unit, such as for example a cathode ray tube towards a second picture that is displayed on a second type of display unit such as for example an LCD. Because first and second type display unit operate according to different standards it is necessary to convert the scanning format in order to enable the display on the second display unit. Other applications of the conversion unit such as for example zooming in or out a picture, PAL towards NTSC conversion or HDTV, so as keystone correction. With keystone correction it is also possible to take into account, during the conversion, a local reduction of the light intensity which is particular to an LCD projection when the projection is not realised according to the main axis.

The conversion device shown in FIG. 1 comprises a low pass filter 1 (anti-alaising filter) to which the analogous video signal or another picture signal of the first picture is supplied. An output of the filter 1 is connected with a data input of an analogous to digital conversion unit 2, of which a further data input directly receives the video signal. A control input of the analog digital conversion unit 2 is connected with an output of a phase locked loop circuit 10 to which first respectively second input the first video signal respectively the pixel clock signal is supplied. The low pass filter 1 can at a certain sampling frequencies lead to a reduction of the sharpness of the video signal. By synchronous sampling the video signal is however directly supplied to the analog digital conversion unit causing the filter to be bypassed. It is also possible to adapt the band width of the filter. In such a manner it is possible to sample, synchronous or asynchronous, the analogous video signal in a substantially optimal manner.

An output of the analog digital conversion unit 2 is connected with an input of a multiplexer 3 an output of which is connected with a memory 4. The multiplexer enables to reduce the speed with which the digital data is written into the memory. The multiplexer also offers the possibility to maintain one frame when use is made of interlaced pictures, provided that the pictures are static. This enables to obtain a substantially maximum sharpness after conversion. The calculation speed is dependent of the speed at which the first picture data are supplied from the first video signal. The addressing of the memory 4 is for example realised by means of independent reading and writing pointers. The reading speed preferably comprises a fixed value simplifying in that way the operation of the device because the subsequent units can than operate at a fixed speed. A data output of the memory 4 is connected with a demultiplexer 5.

The conversion calculation member 7 itself is mounted between two look-up tables 6 respectively 8 of which the first 6 is connected with the demultiplexer output. The conversion calculation member 7 realises the conversion from the first picture composed of M pixels towards the second picture composed of L pixels, by calculating the second pixel values starting from the first pixel values of the first picture. The output of the second look-up table 8 is eventually connected with an input of a digital to analog convertor 9 at which output the analogous video signal for the second picture is supplied.

The memory 4 comprises preferably a FIFO (First In First Out) memory which is each time reset by the vertical synchronisation pulse of the first video signal in order to operate synchronously with the supplied input video signal. The readout of the stored digital data is for example started by initialising a reading address indicator on that position where the desired data starts. By reading it is also possible to read, skip, or even read twice or more, determined pixels or even complete lines, when the picture is linewise built up.

Figure 2:
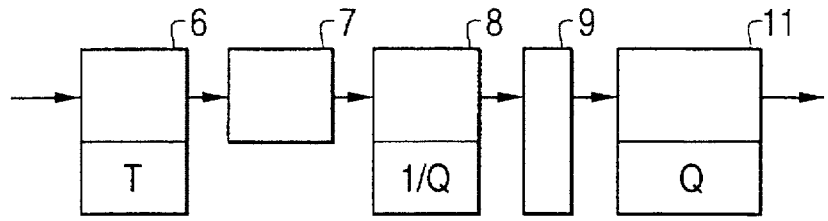
FIG. 2 shows the set-up of the conversion calculation member between two look-up tables.

FIG. 2 shows a preferred embodiment of a part of the conversion unit shown in FIG. 1 and the data processing unit 11 of the display unit connected therewith. To each type of display unit belongs a transfer function which translates the input voltage (Vin) into the luminance (Z). The luminance transmitted by an LCD or a cathode ray tube is a non-linear function of the input voltage. So for example for a cathode ray tube (CRT) the latter is:

$$Z=Z_o+(Z_c-Z_o)(V_{in}/V_{inrw})^\gamma$$

wherein γ represents the non-linear behaviour of the voltage to current transfer for the cathode ray tube display unit, $Z_o$ the luminance for each phosphor particle when no tension is applied on it. $Z_c$ gives the luminance when the supplied voltage is at maximum and $V_{inrw}$ gives the input voltage for the reference white. FIG. 24A shows an example of such a transfer function for a CRT. With a conversion means such as shown in FIGS. 1 and 2 the conversion calculation member 7 is placed between two look-up tables 6 and 8. Those look-up tables have the purpose to store the transfer function components belonging to the selected transfer function. In such a manner look-up table 1 will for example contain the components belonging to the transfer function T shown in FIG. 24A, while look-up table 8 will for example comprise the components belonging to the transfer function T' shown in FIG. 24B. In such a manner it is possible to remove from the first pixel values the compensation for the non-linear behaviour by means of the components stored in the look-up table 6. The conversion then takes place on pixel values which no longer comprise the non-linear behaviour. The latter will then no longer distort the linear behaviour of the conversion itself. By now using the transfer components stored in the look-up table 8 a transfer function can again be applied on the converted pixel values and in such a manner the characteristics of the display unit on which the converted picture will be displayed can be taken into account. In the look-up table 8 the transfer components to be stored are the inverted one of the transfer function components belonging to the transfer function for the used display unit, or a somewhat modified one for each colour.

The execution of a conversion operation on the pixel values on which a transfer function has been applied leads to inaccuracies in the converted picture because the energy values of the pixels are influenced by the non-linearity. Such an energy disturbance is well observed in contrast rich pictures such as for example a white letter on a black background. The non-linear behaviour of the transfer function could lead to a loss of half of the luminance during the conversion. The conversion using surface projection, such as will be described hereinafter, will lead to the presence of as well a black as a white pattern within the projected surface. When a conversion is applied thereon half of the luminance is lost by the non-linear behaviour of the white part.

Generally by loading the first look-up table 6 the first pixel value can be converted towards that intensity on the display unit, which has to be associated with a particular pixel value. The latter being applicable under the condition that the second look-up table 8 be filled in in the manner described hereafter. In such a manner it is for example also possible to add a proper function together with an eventual deviation of the transfer function component added by the picture source. In such a manner it is possible to attribute, for example to pixels with a low intensity, a systematic intensity increase.

The second look-up table 8 takes care of a transfer function operation with a second transfer function which is the inverse one of the transfer function belonging to the type of display unit on which the second picture will be displayed. Suppose for example that the second display unit has a transfer function Q representing the one with which the processing unit 11 processes the second video signal. The second look-up table 8 will then apply a compensation $Q^{-1}$. In such a manner the conversion operation will cause minimal visual changes in function of the conversion factors and the place on the screen in the second picture.

When it is imposed that the second picture should visually come over substantially in the same manner as the first picture, this means that in the second picture and with respect to the first picture no intensity changes which could disturb the visual transfer may occur. In order to realize the latter a predetermined transfer pattern with appertaining transfer function is established. So for example when the first picture is displayed on a cathode ray tube the transfer function γ, given herebefore, will be selected as transfer function T. Now when the second picture has to provide the same impression as the first one, then that transfer function T will be stored in the first look-up table 6.

The effect of round-off errors can be reduced if the internal resolution, that is the resolution between the first and second look-up table, is increased to for example 11 bits if an analogous digital convertor 2 supplies an 8 bits signal.

The same is applicable if the first video signal is artificially formed for example by a personal computer (PC). In the latter case the table 6 is loaded with the first transfer function T if the picture is brought in correspondence with the usual display unit (for example CRT) to which the PC is coupled, in order not to disturb the usual character with which the end user sees the picture.

Furthermore, it is possible to introduce modifications in the total transfer, for example by introducing a non-linear transfer. To this purpose it is sufficient to modify the predetermined transfer pattern and to store in the first look-up table 6 the appertaining transfer function, while the inverse second transfer function ($Q^{-1}$) remains in the second look-up table 8. The second look-up table 8 is only loaded with another transfer function when for example filtered values have to be presented in a different manner or if round-off errors caused by the first and the second transfer functions have to be minimized.

For subsequent pictures or picture fractions, it is possible to modify the content of the second look-up table 8 in function of the modification of the second transfer function Q, in order to always have $Q^{-1}$ in the second look-up table. Such modifications could be dependent from the picture, the time or the temperature.

When a minimum visual effect of the conversion is of minor importance with respect to other factors, such as for example optimum readability of a converted text, it could be of interest to apply another compensation than $Q^{-1}$ with a second look-up table.

The use of look-up tables for executing this operation offers the advantage that they are addressable by means of the pixel coefficients themselves. Per pixel coefficient a suitable compensation component can then be applied.

Figure 3:
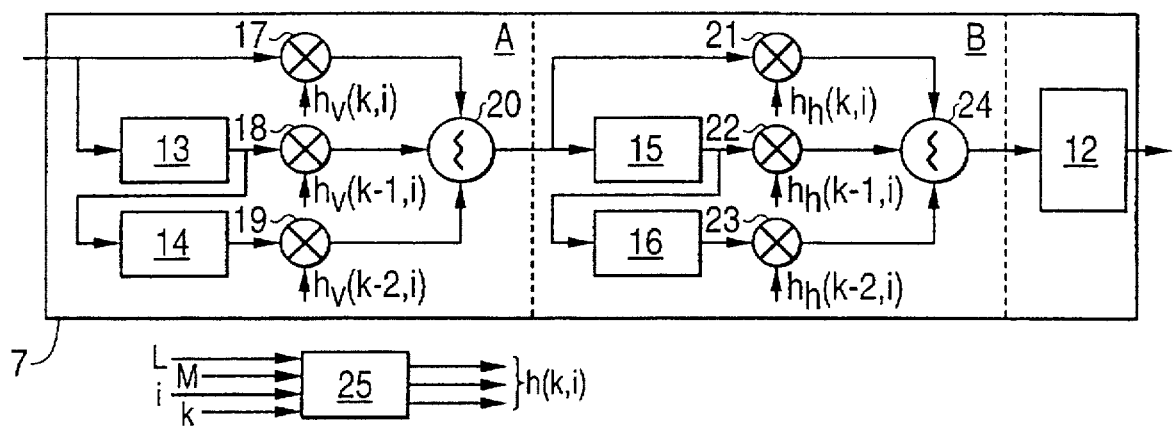
FIG. 3 shows a block scheme of a conversion calculation member belonging to a device according to FIG. 1.

The set-up and the operation of the conversion calculation member will now be described in more detail. The calculation member enables the calculation of the second pixel values in real time. FIG. 3 shows a preferred embodiment of such a conversion calculation member 7. The conversion calculation member comprises two substantially identical parts A and B, wherein the part A respectively B takes care of the vertical respectively horizontal conversion. A FIFO memory 12 forms the output stage of the calculation member. Each part A and B comprises two serially switched delay lines 13, 14, and 15, 16 provided to delay a picture line or pixel, in function of the selected embodiment, over one period of a picture line or pixel. Further each part comprises three multipliers 17, 18, 19 and 21, 22 and 23. A first input of the multiplier 17 respectively 18 and 19 is connected with a data input of the calculation member respectively an output of the first 13 and the second 14 delay line. At a second input of the multiplier 17, 18, 19 and 21, 22, 23 weight factors $h_v((k, i)$ or $h_h(k, i)$ ($1 \leq k \leq 3$) are supplied dependent on whether it relates to a vertical or a horizontal interpolation. The weight factors are determined by a determination unit 25, for example a microprocessor or a PLA (Programmable Logic Array) at which input the values M (=the number of pixels of the first picture), L (=the number of pixels of the second picture), i (=the second pixel to be calculated) k (=the considered variable) are supplied. When however the calculation member is provided to realize a fixed conversion from a fixed value M towards a fixed value L then the calculation unit 25 can be substituted by a memory wherein predetermined weight factors h(k, i) are stored. That memory can be as well a ROM wherein fixed values are stored, as a RAM wherein each time different weight factors can be stored. The calculation of the h(k, i) values will be described hereinafter. The output of each of the multipliers 17, 18, 19 respectively 21, 22, 23 is connected with a respective input of a summation member 20 respectively 24.

The conversion of a first picture composed of M (M∈N) pixels towards a second picture composed of L (l∈N) pixel can as well relate to a conversion towards a value L<M as towards a value L>M. When L<M respectively L>M the latter is indicated as a down respectively an up conversion. For the sake of clarity both possibilities will be described separately.

Consider first a one-dimensional down conversion for example from M=9 pixels towards L=6 pixels such as illustrated in FIG. 4. To each $j^{th}$ first pixel ($0 \leq j \leq M-1$) belongs a first pixel value x(j) which represents the intensity of that $j_{th}$ pixel. Such a pixel represents in fact a surface piece of the display unit as is also illustrated in FIG. 4 wherein the pixels are thereupon matrixwise aligned. The matrix set-up is however not necessary for the execution of the method according to the invention. The pixels can for example also be linewise set up wherein the pixels of two or more subsequent lines are mutually shifted. The calculation given hereunder and implementation can take the latter into account.

The pixel value y(i) ($0 \leq i \leq L-1$) of the second picture are now determined as follows for a downward conversion:

$$y(i) = \sum_{n=0}^{s-1} h(k,i) \times (k) \quad (1)$$

$$\text{with } k = \left[ \frac{i \cdot M}{L} \right] + n \quad (2)$$

the first pixel value to be considered wherein [ ] represents the mathematical function "entier", s the number of pixels to be considered and the weight factor $$h(k,i) = \frac{(\min(L(k+1), M(i+1)) - \max(L \cdot k, M \cdot i))}{M} \quad (3)$$

and if h(k, i)<0 then the value h(k, i)=0. In the considered example M=9, L=6:

$$\text{for } i = 0, k = \left[\frac{0.9}{6}\right] + n \text{ or } k = n$$

$$\text{for } i = 1, k = \left[\frac{1.9}{6}\right] + n \text{ or } k = 1 + n$$

$$\text{for } i = 2, k = \left[\frac{2.9}{6}\right] + n \text{ or } k = 3 + n$$

$$y(0,0) = h(0,0)\, x(0,0) + h(1,0)\, x(1,0) + h(2,0)\, x(2,0)$$
$$y(0,1) = h(0,0)\, x(0,1) + h(1,0)\, x(1,1) + h(2,0)\, x(2,1)$$
$$y(0,2) = h(0,0)\, x(0,2) + h(1,0)\, x(1,2) + h(2,0)\, x(2,2)$$

In the set of three equations for the three second pixels belonging to the first row of the second picture, the same weight factors are attributed to the first pixel values belonging to a same line in the first picture. So to x(0,0), x(0, 1) and x(0,2) belonging to the first row of the first picture, the weight factors h(0,0) are attributed. In general when the picture is linewise built up a set of q(=the number of pixels per line in the second picture) equations is set up for each $p^{th}$ line in the second picture ($0 \leq p \leq P-1$; P number of lines in the second picture). Per set of q equations each time a same weight factor is attributed to the pixel values of the first picture which belongs to the same line. The reason therefor is that each pixel from a same row furnishes a same contribution when a one-dimensional conversion is considered.

In the chosen example three weight factors have thus to be determined, namely h(0,0), h(1, 0) and h(2,0).

$$\begin{aligned}
h(0,0) &= (\min(6(0+1), 9(0+1)) - \max(6.0, 9.0))/9 \\
&= 1/9\, (\min(6, 9)) \\
&= 2/3 \\
h(1,0) &= (\min(6(1+1), 9(0+1)) - \max(6.1, 9.0))/9 \\
&= (\min(12, 9) - \max(6, 0))/9 \\
&= (9-6)/9 = 1/3 \\
h(2,0) &= (\min(6(2+1), 9(0+1)) - \max(6.2, 9.0))/9 \\
&= (\min(18, 9) - \max(12, 0))/9 \\
&= (9-12)/9 \\
&= 0 \text{ because the calculated result is smaller than 0.}
\end{aligned}$$

The set of equations thus becomes:

$$y(0,0) = 2/3\, x(0,0) + 1/3\, x(1,0) + 0\, x(2,0)$$
$$y(0,1) = 2/3\, x(0,1) + 1/3\, x(1,1) + 0\, x(2,1)$$
$$y(0,2) = 2/3\, x(0,2) + 1/3\, x(1,2) + 0\, x(2,2)$$

From this set of equations it now appears that the first and the second row of pixels from the first picture furnishes a contribution row the first row of the second picture, while a third row does not furnish a contribution. In order to determine which pixels x(k) furnish a contribution to the second pixel y(i) of the second picture, in fact the surface of that pixel y(i) is projected on a corresponding location in the first picture. For that purpose the surface of the first respectively second picture is first divided in M respectively L picture segments which each time correspond with the surface of the corresponding pixel. For the pixel y(0, 0) of FIG. 4 that projection signifies that this pixel overlaps completely x(0, 0) and partially x(1, 0). The pixels x(0, 0) and x(1, 0) are thus those who furnish a contribution to y(0, 0) and the equations set up therefor. The weight factor h(k, i) then indicates that part of the surface of y(i) that is occupied by the $k^{th}$ first pixel. For the pixel y(0, 0), x(0, 0) respectively x(1, 0) occupies 2/3 respectively 1/3 of the surface of y(0, 0).

From the projection of y(1, 0) on the first picture it can be derived that x(1, 0) and x(2, 0) are the two first pixels which furnish a contribution to y(1, 0) while x(0, 0) does not furnish a contribution. The weight factor h(1, 1) respectively h(2, 1) are equal to 1/3 resp. 2/3 because x(1, 0) resp. x(2, 0) occupies 1/3 resp. 2/3 of the surface of y(1, 0). Thereupon $$\sum_k h(k,i) = 1$$

in such a manner that h(1, 0)=1−h(0, 0) and thus h(1, 0)=1/3 because the total surface has to be occupied.

By determining the weight factors in such a manner the real width of the picture or the picture line as well as the position of the pixel or pixel line in the total picture is taken into account. This signifies that the total energy belonging to a pixel or a picture line is taken into account enabling a more reliable display of the picture and that the contours in the picture are more sharply defined.

The calculation of the pixels y(1, 0), y(1, 1) and y(1, 2) of the second line in the second picture is realized in an analogous manner.

$$y(1,0) = h(0,1)\, x(0,0) + h(1,1)\, x(1,0) + h(2,1)\, x(2,0)$$
$$y(1,1) = h(0,1)\, x(0,1) + h(1,1)\, x(1,1) + h(2,1)\, x(2,1)$$
$$y(1,2) = h(0,1)\, x(0,2) + h(1,1)\, x(1,2) + h(2,1)\, x(2,2)$$

$$\begin{aligned}
h(0,1) &= (\min(6(0+1), 9(1+1)) - \max(6.0, 9.1))/9 \\
&= [\min(6,18) - \max(0, 9)]/9 \\
&= [6-9]/9 \\
&= 0 \\
h(1,1) &= (\min(6(1+1), 9(1+1)) - \max(6.1, 9.1))/9 \\
&= (\min(12,18) - \max(6, 9))/9 \\
&= 1/3 \\
h(2,1) &= (\min(6(2+1), 9(1+1)) - \max(6.2, 9.1))/9 \\
&= (\min(18,18) - \max(12, 9))/9 \\
&= 2/3
\end{aligned}$$

$$y(1,0) = 1/3\, x(1,0) + 2/3\, x(2,0)$$
$$y(1,1) = 1/3\, x(1,1) + 2/3\, x(2,1)$$
$$y(1,2) = 1/3\, x(1,2) + 2/3\, x(2,2)$$

The calculation has been pixelwise presented at this stage, but it is also possible to realize the latter linewise.

$$y(0) = 2/3\, x(0) + 1/3\, x(1)$$

$$y(1) = 1/3\, x(1) + 2/3\, x(2)$$

In the considered embodiment the summation is each time limited to two coefficients. In practice for a conversion M/L≤2 a summation over three picture values is enough because further picture values do not contribute, due to the fact that their weight factor equals 0. Raising the conversion degree M/L towards M/L>2 with three summations is possible but reduces the efficiency.

The up-conversion will now be described by means of the example shown in FIG. 5 wherein a conversion from M=2 to L=3 picture lines is considered. The pixel value y(i) is now determined as follows:

$$y(i) = \sum_{n=0}^{1} h'(k,i)\, x(k+n) \quad (4)$$

$$\text{with } k = \left[\frac{i \cdot M}{L}\right] \quad (5)$$

wherein [●] again represents the mathematical function "entier" and $$h'(k,i) = h(k,i) \text{ when } n=0$$

and $h'(k,i) = 1 - h(k,i)$ when n=1 with $$h(k,i) = (\min(L \cdot (k+1), M(i-1)) - \max(L \cdot k, M \cdot i))/M \quad (6)$$

Figure 5:
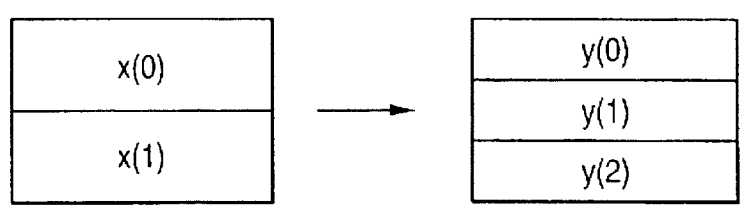

In the embodiment according to FIG. 5, the latter thus becomes:

$$i=0, k=\left[0 \cdot \frac{2}{3}\right] \rightarrow k=0$$

for $$i=1, k=\left[\frac{1 \cdot 2}{3}\right] \rightarrow k=0$$

$$i=2, k=\left[\frac{2 \cdot 2}{3}\right] \rightarrow k=1$$

$y(0) = h(0,0)\ x(0) + h'(0,0)\ x(1)$
$y(1) = h(0,1)\ x(0) + h'(0,1)\ x(1)$
$y(2) = h(1,2)\ x(1) + h'(1,2)\ x(2)$ $h(0,0)$ = $(\min(3(0+1), 2(0+1) - \max(3.0, 2.0))/2$
 = $(\min(3,2))/2$
 = 1

$h'(0,0) = 1 - h(0,0) = 0$
$h(0,1)$ = $(\min(3 \cdot (0+1), 2 \cdot (1+1)) - \max(3.0, 2.1))/2$
 = $(\min(3,4) - \max(0,2))/2$
 = 1/2

$h'(0,1) = 1 - h(0,1) = 1/2$
$h(1,2)$ = $(\min(3(1+1), 2(2+1)) - \max(3.1, 2.2))/2$
 = $(\min(6,6) - \max(3,4))/2$
 = 1
$h'(1,2) = 1 - h(1,2) = 0$ The equations for the pixel lines thus become:

$y(0)=x(0)$ $y(1)=\frac{1}{2}\ x(0)+\frac{1}{2}\ x(1)$ $y(2)=x(1)$

A pixelwise up conversion is of course realized in an analogous manner.

Also for an up conversion it is true that the weight factors are obtained by superposition of the surface. Superposition of for example y(1) on the first picture shows that, as well by x(0) as by x(1) a part of the surface of y(1) is occupied and in such a manner that each occupy half of the surface.

Coming back to the circuit represented in FIG. 3 the weight factors h(k, i) and h'(k, i) are determined by the calculation unit 25 which for that purpose is programmed with the formulas given herebefore. The delay elements 13, 14 or 15, 16 serve the purpose of simultaneously supplying the necessary pixel values x(k) to the respective multiplication element 17, 18, 19 or 21, 22, 23 and of calculating in such a manner the value of the resp. h(k, i) x(k). The summation itself is realized by the summation element 20 or 24.

In the examples given herebefore only a conversion in a vertical direction has been described while in the horizontal direction the number of pixels remained the same. Only the part A of the conversion member has been activated. A conversion in a horizontal direction occurs in an analogous manner to a conversion in the vertical direction and will therefor not be described in detail.

For the sake of clarity in the described embodiment for determining the pixel values y(i) of the second picture the sharpness control has not been taken into account. The method and device according to the invention however enable to take into account the latter by means of an adaptation of the calculation method. The expression (1) for y(i) with a down conversion remains unchanged while expression (2) becomes:

$$k=\left[\frac{(i \cdot M)-\left(\frac{W-M}{2}\right)}{L}\right]+n$$

wherein $W=w1$ represents the width of the second pixel and w the sharpness factor.

$w=0$ respectively $w=1$ are conversions known as such, namely conversion between neighbours resp. linear interpolation. In the embodiment described herebefore, $w=M/L$ in such a manner that $W=M$ and $$k=\left[\frac{i \cdot M}{2}\right]+n$$

When $w=1$ and $W=L$, the width of the first and the second picture is chosen equal to each other, as it is the case in linear interpolation. Besides the value $w=0, 1, M/L$ w can also have other positive values.

Expression (3) then becomes:

$$h(k,i) = \frac{(\min(L(k+1), M(i+1) + (W-M)/2) - \max(L \cdot k, M \cdot i - (W-M)/2))}{W}$$

For an up conversion expression (5) becomes:

$$h(k,i)=\left[\frac{(i \cdot M)-\left(\frac{(W-M)}{2}\right)}{L}\right]$$

and expression (6) becomes:

$$h(k,i) = \min\left(L \cdot (k+1), M(i+1) + \left(\frac{W-M}{2}\right)\right) - \max\left(L \cdot k, M \cdot i - \frac{W-M}{2}\right))/W$$

By multiplication by a sharpness factor w, the surface of the $i^{th}$ second picture segment becomes variable, enabling to implement different types of filters without spoiling the effects of the projection itself. A good compromise between picture sharpness and visible errors in the second picture forms the choice of a surface sharpness factor wherein the surface of the second pixel is invertedly proportional with the total number of pixels.

By selecting a sharpness factor $w \neq 1$, a larger degree of freedom can be obtained in the surface division of the second picture enabling to take into account conversion effects such as luminance lost and visually, a substantially identical impression can be obtained in the first and second picture.

The combination of a conversion method with a sharpness factor adjustment and the presence of two look-up tables offers the possibilities to avoid non-linearities in the conversion, while within the conversion itself an additional freedom degree is created. By these possibilities care is taken that the visual effect between the first and the second picture remains substantially the same, or can be manipulated. With such a manipulation it is then possible to locally increase or reduce the luminance in order to improve she readability of text for example. By local manipulation the remaining part of the picture is not perturbed. The two look-up tables enable such a manipulation because the luminance can thus be modified for high frequency information.

Besides a one-dimensional conversion it is also possible to convert the picture in two dimensions. For that purpose both parts of the calculation member 7 are activated. The principle of an M to L pixels conversion remains the same because the number of pixels is not limited to one dimension. With a two-dimensional conversion there is for example first applied a conversion in the vertical direction, and thereafter a conversion in the horizontal direction.

Suppose that a first picture with M=9 first pixels set up according to a 3×3 matrix is converted towards a second picture comprising L=4 second pixels, wherein the second pixels are set up according to a 2×2 matrix. First a conversion M→L'=6 will take place wherein the six pixels are set up according to a 2×3 matrix. That conversion is analogous to the one described by means of FIG. 4. Thereafter an L' to L conversion will be executed starting from the six pixels determined in the first conversion step. Again use is made of the conversion formula described herebefore.

The pixel values of the second picture will now be indicated with y'(0, 0), y'(0, 1), y'(1, 0) and y'(1, 1) and the pixel values of the 2×3 picture with y(0, 0), y(0, 1), y(0, 2), y(1, 0), y(1, 1) and y(1,2) (see FIG. 4).

$$y'(0,0) = \tfrac{2}{3} y(0,0) + \tfrac{1}{3} y(0,1) + 0 \cdot y(0,2)$$

making use of the already determined value for the pixel value y(i):

$$y'(0,0) = \tfrac{4}{9} x(0,0) + \tfrac{2}{9} x(1,0) + \tfrac{2}{9} x(0,1) + \tfrac{1}{9} x(1,1)$$

The remaining pixel values will be determined in an analogous way.

The advantage of executing the picture conversion in two steps is that the number of multiplications remains limited. But the two-dimensional conversion can also be executed during a same step, namely by using the following formula for a down conversion without sharpness factor adjustment:

$$y(i',i) = \sum_{n'=0}^{s'-1} \sum_{n=0}^{s-1} h''(k',i') \, h(k,i) \, x(k',k)$$

wherein s resp. s' represents the number of summations for the pixels resp. the pixel lines in the formula:

$$k = \left[\frac{i \cdot M}{L}\right] + n \ \text{and} \ k' = \left[\frac{i' \cdot M}{L}\right] + n'$$

and $$h(k,i) = (\min(L(k+1), M(i+1)) - \max(L \cdot k, M \cdot i))/M$$

and when h(k,i)<0 then h(k,i)=0 as also $$h''(k', i') = (\min(L'(k'+1), M'(i'+1)) - \max(L' \cdot k', M' \cdot i'))/M'$$

when h''(k', i')<0 then h''(k', i')=0 where M' resp. L' comprising the number of active lines in the first resp. second picture. For an upward conversion use is then made of:

$$y(i',i) = \sum_{n',n=0}^{1,1} h''(k',i') \cdot h(k,i) x(k' + n', k + n)$$

wherein $$k = \left[\frac{i \cdot M}{L}\right]$$

$$k' = \left[\frac{i'M}{L'}\right]$$

h'(k,i)=h(k,i) as n=0 and h'(k,i)=1−h(k,i) as n=1, h'''(k',i')= h''(k',i') as n'=0 and h'''(k',i')=1−h''(k',i') as n'=1.

Combinations of up and down conversions are also possible, such as for example up conversion in vertical direction and down conversion in horizontal direction.

As already described, the calculation of the weight factors can be realized by means of software using a programmed calculation member 25 (FIG. 3) or by means of the addressing of a memory wherein the weight factors are stored. The weight factors can also be determined by hardware with a high processing speed, as will be described hereunder. The latter embodiment has the advantage that non-linear conversion on a same picture can occur. So for example a first part of the picture can undergo an M→L conversion while a second part can undergo an M→L' conversion. Such a non-linear conversion has the advantage that it can be applied for example for keystone correction with projection. Linewise variation of the conversion is also possible within a same picture.

FIG. 6 shows an example of a hardware embodiment of a part of the calculation member 25 making part of the conversion device according to the invention. The calculation member comprises an accumulator 26 which has for example a 14 bits equivalent resolution. At an input of the accumulator the value L/M is supplied, for example by means of a 14 bits digital word. The accumulator further receives a clock signal, related to the pixel clock for the horizontal direction, which is used for sampling the video signal as well as for the horizontal picture synchronization signal for horizontal conversion. The accumulator adds with each clock pulse of the pixel clock the value L/M to its actual value. The accumulator has a first resp. a second output at which the most significant bits (MSB) of the actual value resp. a carry signal is supplied. The outputs are connected with a memory 27, for example a PROM, comprising a first A and a second B part. The first resp. the second cart is destined for down resp. up conversion. The selection of a memory part is realized by means of a control signal indicating whether it relates to a down or an up conversion. The division of the memory is for example realized on the basis of the memory addresses wherein for example the addresses with the MSB equal to "0" resp. "1" are assigned to the down resp. up conversion. The control signal is then simply formed by a one bit signal indicating the MSB address bit. Further the value L/M is also supplied at the input 13 after memory 27. For two-dimensional conversions use is made of two accumulators.

The operation of the calculation member will now be described by means of an example wherein the selected down conversion is a conversion from M=700→L=300 pixels. The second pixel value y(0) of the second picture has now the following equation:

$$y(0) = \tfrac{3}{7} x(0) + \tfrac{3}{7} x(1) + \tfrac{1}{7} x(2)$$

$$y(0) = h(0,0) \, x(0) + h(1,0) \, x(1) + h(2,0) \, x(2).$$

With subsequent clock pulses $t_1$, $t_2$ and $t_3$ the accumulator 26 forms the following values (ACC):

$t_1 \to \text{ACC} = \tfrac{3}{7} \bmod \tfrac{7}{7} = \tfrac{3}{7}$ no carry $t_2 \to \text{ACC} = \tfrac{3}{7} + \tfrac{3}{7} = \tfrac{6}{7} \bmod \tfrac{7}{7} = \tfrac{6}{7}$ no carry $t_3 \to \text{ACC} = \tfrac{6}{7} + \tfrac{3}{7} = \tfrac{9}{7} \bmod \tfrac{7}{7} = \tfrac{2}{7}$ carry The accumulator is adjusted in such a manner that it counts modulo L/M and each time, upon reaching the value L/M, a carry signal is output. The memory 27 will now output the following values, dependent of their addressing. When no carry signal is output, as it is the case with $t_1$ and $t_2$, the memory will output the value L/M which will be supplied at input B. In the example this gives:

$t_1$: h(0,0)=3/7, $t_2$: h(1,0)=3/7

If however a carry signal is output, as it is the case at $t_3$, then the memory outputs the value L/M-ACC. In the example this means: h(2,0)=3/7−2/7=1/7. In the meantime h(0,1)=ACC=2/7 is also available.

According to another embodiment it can already be determined at $t_2$ and from h(0,0)+h(1,0)=6/7 that on $t_3$ a carry signal will be generated, and on $t_2$ h(1,0)=L/M and h(2,0) =1−L/M can be determined.

For an up conversion the B part of the memory is selected. Consider now the example:

M=300, L=700 L/M=7/3 y(0)=1.x(0)

y(1)=1.x(0)

y(2)=1/3 x(0)+2/3 x(1)

When the accumulator receives a value L/M>1 then it determines $(L/M)^{-1}$ and calculates that value. Again the clock times $t_1$, $t_2$ en $t_3$ are considered:

$t_1 \rightarrow$ ACC=3/7 no carry $t_2 \rightarrow$ ACC=3/7+3/7=6/7 no carry $t_3 \rightarrow$ ACC=6/7+3/7=9/7 mod 7/7=2/7 carry The memory shall now furnish the following values, dependent of their addressing. When no carry signal is output, as it is the case with $t_1$ and $t_2$, the memory outputs the value "1". When a carry signal is output, as it is the case with $t_3$, then:

ACC×(L/M) and (1−(ACC×(L/M)))

In the considered example this gives:

2/7×7/3=2/3 and 1−2/3=1/3.

According to another embodiment a multiplication with L/M is executed for an up conversion at each clock pulse. This then furnishes:

$t_1$=3/7×7/3=1→1→because ACC×L/M≧1

$t_2$=6/7×7/3=2→1→because ACC×L/M≧1

$t_3$=9/7×7/3=2/3→because ACC×L/M<1 and 1−2/3=1/3.

With a further preferred embodiment wherein the sharpness factor W is considered, the accumulator receives at a said input a single offset value, $$\left(-\frac{W-M}{2L}\right)$$

while at the memory instead of L/M the value L/W is supplied. The accumulator then does not start with the value 0 but with the offset value. For the same conversion M=3, L=7 and for a value w=1, W=wL→W=L, while the offset value $$\frac{W-M}{2L} = 2/7.$$

At the clock moments $t_1$, $t_2$ and $t_3$ the following values are generated.

$t_1$: 2/7→y(0)=2/7 x(−1)+5/7 x(0)

$t_2$: 5/7→1/7 and carry y(1)=6/7 x(0)+1/7 x(1)

$t_3$: 4/7→y(2)=3/7 x(0)+4/7 x(2) and no carry.

For each accumulation step two coefficients are calculated. The second coefficient=ACC×L/W max. 1 and the first=1−second coefficient, wherein a new pixel is considered upon a carry.

From the value y(0), y(1) and y(2) it appears that the latter is generated by a bi-linear interpolation.

For w=5/7, W=6 and the offset value will be 3/14, at a clock pulse this gives:

$t_1$: 3/14→y(0)=1/4 x(−1)+3/4 x(0)

$t_2$: 15/14→1/14 and carry y(1)=11/12 x(0)+1/12 x(1)

$t_3$: 7/14→1/2 y(2)=5/12 x(0)+7/12 x(1)

In this manner the surface of the second pixel is multiplied with the sharpness factor.

The output of the accumulator can also be connected with a RAM or a PROM without having the value L/M or L/W supplied thereto. The RAM or PROM is then loaded with the adequate values for the conversion ratio and for the selected sharpness. Preferably with a simultaneous two-dimensional conversion, a horizontal and a vertical output signal of the accumulator is supplied to the RAM or PROM in order to determine the weight factors for a horizontal and a vertical conversion.

The phase locked loop circuit 10, hereinafter called PLL, from the conversion device according to the invention will now be described in more detail. FIG. 7 shows a block scheme of a preferred embodiment of a PLL. The circuit comprises an adjustable delay line 28 whose data input receives a picture synchronisation signal, for example the horizontal synchronisation signal. A control input of the delay line 28 is connected with an output of phase signal generator 24 whose data input receives the image information signal, and whose clock input is connected with an output of the PLL.

A data output after the delay line 28 is connected with a data input of a phase comparator 29, whose data output is connected with an input of a filter 30. An output of the filter 30 is connected with an input of a voltage controlled oscillator 31, whose output is connected with an input of a first programmable divider 32. A predetermined value is supplied at a further data input of the first divider 32. The output of the first divider forms the output of the PLL. The output of the PLL is further connected with an input of a second programmable divider 33 whose output is connected with a control input of the phase comparator 29. At a further data input of the second divider 32 a predetermined number of pixels is supplied.

With another embodiment of the PLL, a further adjustable delay line is provided after the first divider 32. That delay line is controlled by the generator 34. The PLL operates further analogously. The further delay line can operate in combination with the delay line 28. The delay line 28 could also not be present in this configuration.

The PLL multiplies, when it has been correctly adjusted, the input picture synchronisation signal with the exact number of active and blanking pixels of the first picture in order to reconstruct the original digital analogous conversion clock frequency with synchronous sampling. The phase of the generated clock can by means of the delay line 28 be shifted with respect to the picture synchronisation signal in order to adjust synchronously in phase the clock signal with the picture synchronisation signal. The adjustment of the delay line can be realized either manually or automatically by using a phase signal generator 34.

The PLL, with exception to the generator 34, is known as such, and the operation thereof will therefor not be further described in detail. Only the set-up and the operation of the generator in connection with the PLL will be described in more detail.

It has to be observed that the picture information signal should comprise a picture content and a synchronisation component in order to enable the operation of the PLL. Further the picture content component has to be derived from a digital signal that has been converted, by means of D/A conversion unit, towards an analogous signal for synchronous sampling. The object is to recuperate the pixel clock in such a manner that there is correspondence with the one with which the D/A conversion has taken place.

The generator 34 comprises a differentiation unit 35 whose output is connected with an input of a comparison unit 36 such as shown in FIG. 8. The differentiation unit receives the picture information signal. The generator 34 is operable when the picture information signal comprises high frequency components such as shown in FIG. 9A. When such components are not present the delay line 28 keeps its adjustment unchanged. When the picture information signal comprises for example text, such high frequency components are present and the adjustment of the delay line 28 shall occur. When the picture only comprises black pixels then the generator is not active.

The differentiation unit 35 applies a mathematical differentiation on the picture information component (FIG. 9B) in order to extract the high frequency components from the image information signal. The comparison unit 36 compares the differentiated picture information signal with a predetermined voltage level of for example half of the maximum video input voltage supplied to a further input of the comparison unit. In such a manner the comparison unit assures that only the peaks that are higher or equal to that voltage level are allowed to pass in order to supply a reliable video pulse series. With another embodiment two comparison units are used in order to detect and to take into account also down going edges. FIG. 9C shows such a video pulse series derived from a video signal according to FIG. 9A. These series of video pulses represent a first phase signal that is associated with the picture content of the video picture and represents as is to say the phase of the video picture The thus formed video pulse series is supplied to a flip-lop circuit 43, shown in FIG. 10. That circuit is part of the generator 34. The flip-flop circuit comprises a first 37 and a second 38 flip-flop. The video pulse series (FIG. 11A) is supplied to the clock input of the first flip-flop 37, to which D-input a signal with logical value "1" is supplied. The Q-output of the first flip-flop 37 is connected with the asynchronous reset input of the second flip-flop 38 and the reset input of the first flip-flop is connected with the Q-output of the second flip-flop. At the clock input of the second flip-flop, the clock signal (FIG. 11B) formed by the PLL is supplied. The D-input of the second flip-flop 38 also receives the signal with the logical value "1". The Q-output of the first flip-flop 37 is connected with a line 39.

The operation of that flip-flop circuit will now be described. The leading edge of a pulse from the video pulse series (FIG. 11A) clocks the first flip-flop 37 in such a manner that, at its Q-output, the signal with logical value "1" supplied at its D-input is output (FIG. 11c). The leading edge of the clock signals clocks the second flip-flop 38 which has as consequence that the value logic "1" at its Q-output is output. This causes the first flip-flop to be reset, which signifies that its Q-output goes low. The output signal OT1 on line 39 also goes down (FIG. 11C). The down going of Q raises $\bar{Q}$ at the first flip-flop in such a manner that the second flip-flop is reset.

The output signal OT1 on line 39 thus goes high synchronously with the raising or a pulse from the series of video pulses forming said first phase signal associated with the video picture. The output signal OT1 goes down with a raising edge of the pixel clock signal. This signifies that the width of the pulse of the OT1 signal is determined by comparison of the picture phase signal and the pixel clock pulse and indicates the phase difference therebetween. The larger the pulse from the signal OT1, the higher the phase difference between both signals. When the pulse with ΔT of OT1 equals half of the period of the clock signal, it is derived therefrom that the pixel clock and the video picture are in phase with each other. When ΔT becomes larger resp. smaller, than the phase difference increases resp. decreases.

By adjusting in phase with each other the pixel clock and the video picture care is taken that the analog digital conversion unit 2 samples the picture information signal at the most favourable time. That is probably in the middle between two occurring edges.

In order to simplify the adjustment of the delay line 28 the generator 34 comprises further components which will now be described. FIG. 12 shows a block scheme of such a further component 42 which also comprises two flip-flop 40 and 41. The first flip-flop 40 receives at its clock input the video pulse series (FIGS. 9c and 14a) and at its D-input the signal with a value "logic 1". The Q-output of the first flip-flop 40 is connected with the D-input of the second flip-flop 41 at which clock input the pixel clock signal (FIGS. 11b, 14b) is supplied. The Q-output of the second flip-flop 41 furnishes a signal OT2 (FIG. 14d) which inter-alia resets the first flip-flop.

The raising edge of a pulse from the video pulse series (FIG. 14a), supplied at the clock input of the first flip-flop 40, assures that the value "logic 1" is presented at a Q-output resp. D-input of the first 40 resp. second 41 flip-flop. The second flip-flop is not active at that moment because the clock (FIG. 14b) is low. The raising edge of the subsequent clock pulse, substantially half a clock period later, now clocks the second flip-flop 41 in such a manner that the signal supplied at the D-input is output at the Q-output. The signal OT2 at the Q-output now goes high (FIG. 14d) causing the reset of the first flip-flop 40. With the subsequent raising edge of the clock, the Q-output of the second flip-flop will go down, causing the signal OT2 to go down also. The pulse width of the signal OT2 thus precisely corresponds with the period of the clock signal used for sampling.

The derivation of the signal OT2, as it has been described, offers the advantage that the circuit each time forms a signal OT2 for each supplied clock frequency, the pulses of the signal OT2 having a width of one clock period. Further the A/D conversion unit will always sample at the correct time at the PLL output, independently of the frequency of the pixel clock, because the signal OT2 takes the frequency of the pixel clock into account. With an alternative embodiment wherein the clock frequency remains unchanged, the signal OT2 can also be formed for example by a pulse generator.

Figure 14A:
Figure 14B:
Figure 14C:
Figure 14D:
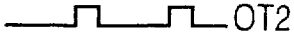
Figure 14E:
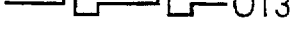
Figure 14F:
Figure 14G:

The flip-flop circuits 42 resp. 43 of FIG. 10 resp. 12 are part of the circuit represented in FIG. 13. The signal OT1 is supplied at a first input of an analogous summation unit 44, while at its second input, half of the intensity of the signal OT2 (thus ½ OT2) is received. The analogous summation unit forms a signal OT3=OT1–½ OT2 (FIG. 14e). The division by two of the signal OT2 is for example realized by means of a series switch of two resistances 45, 46 having the same value. The second input of the analogous summation unit 44 is connected with the connection between the two resistances. The signal OT3 is transmitted via a low pass filter 47 and forms in such a manner the signal OT4 (FIG. 14f).

The signal OT4 gives a direct current level, whose value represents the phase difference between the pixel clock phase and the phase associated to the video signal. When both signals are in phase with each other, then the surface of one pulse of the signal OT1 equals half of the surface of a pulse of the signal OT2 and OT3=0 which means that OT4=0 volt. Indeed the pulse width of OT1 gives the phase difference between both signals. When there is now a phase difference between the pixel clock phase and the phase of the video signal, then, as already described, the width of the pulses of OT1 will change thus causing OT3≠0 because ½ OT2 remains unchanged. When the pulse width of a pulse of the OT1 signal is more resp. less then half a clock period then OT4>0 resp. OT4<0. The voltage level of OT4 thus clearly represents the phase difference.

In order to have the adjustment of the delay line synchrone with the pixel synchronisation frequency, she generator 34 comprises a synchronisation circuit, a block scheme of which is shown in FIG. 15. That synchronisation circuit, comprises a double comparison unit 48 at which data resp. clock input the signal OT4 resp. for example the picture synchronisation pulses are supplied. With each input synchronisation pulse the comparison unit compares the level of the supplied OT4 signal with predetermined preset values or with a value that is related to the picture content. When the signal OT4 indicates or passes a predetermined positive resp. a predetermined negative voltage, a signal with logic value "1" resp. "–1" is output at the output of the comparison unit 48. When the signal OT4 has a voltage situated inbetween the predetermined preset values, then a logic "0" is supplied at a counter 49. In such a manner the counter 49 is incremented, decremented or remains in its actual position. The actual status of the counter is then supplied to the delay line 28 enabling a correct automatic adjustment of the latter.

With the configuration wherein the further delay line is situated after the first divider, of course that further delay line will be adjusted in a comparable manner. The advantage of this configuration is that fast high frequency jitter (larger then the band width of the PLL), can also be removed by adjustment. The generator 34 operates then with a higher frequency.

FIG. 16 shows another embodiment of the PLL circuit. That embodiment is provided to enable the detection of the number of pixels. For the sake of clarity only the differences with the PLL shown in FIG. 7 will be described. At the control input of the delay line 28 a sweep signal is supplied, that is to say, a signal that starts with a first value and changes stepwise or continuously towards a second value. The output of the generator 34 is connected with a detector 50.

Figure 18:
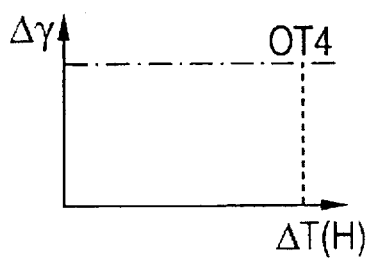

When the set number of pixels supplied to the divider 33 is correct, then the phase difference Δ100 as shown by the signal OT3 or OT4 will remain constant during a period ΔT (H) of the horizontal picture synchronisation signal such as shown in FIG. 17. Depending on the preset phase, namely by the adjustment of the delay line 28, the phase difference can change as shown in FIG. 18 where an increase of the phase difference is shown. That increase is now represented by an increase of the voltage level of the signal OT4. Indeed another adjustment of the delay line 28 will lead to a change in the phase difference. With a correct adjustment of the number of pixels, the phase difference will remain constant within a period.

Figure 19:
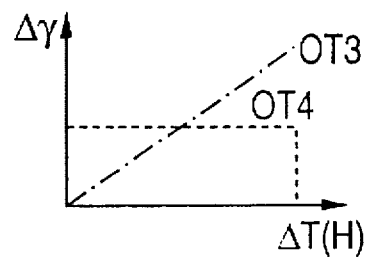
Figure 20:
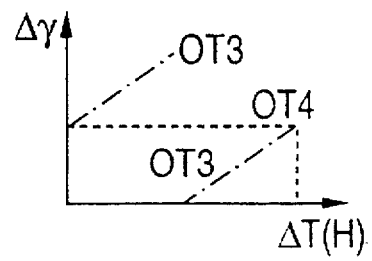

When the set number of pixels is incorrect, the phase difference can increase during one period ΔT(H) as shown in FIG. 19. Because the number of pixels is incorrect, for each pixel there will be sampled at a different place in such a manner that within a period ΔT(H) the phase will change, provided that the adjustment of the delay line remains unchanged within that period. The signal OT3 will thus increase while as a consequence of the filter 47 the signal OT4 will remain unchanged within that same period ΔT(H). When thereupon the adjustment of the delay line 28 has another value, for example by means of the sweep signal, while the number of pixels is incorrect, then OT4 remains unchanged while OT3 increases and eventually jumps halfway the period as is shown in FIG. 20. On the contrary when the set number of pixels is correct then OT4 will change synchronously with the sweep signal. The phase shift follows the changes in the adjustment of the delay line. In such a manner it is thus possible to adjust the number of pixels by means of the PLL shown in FIG. 16.

When the sweep signal is supplied, the phase difference OT4 will accurately follow the evolution of that signal, provided the number of pixels is correct. When that number is incorrect, then OT4 will less accurately follow the sweep signal during the whole sweep period. By having the detector 50 following that evolution and controlling if OT4 follows, it can be determined whether the set number of pixels is correct. The correct number of pixels is then established by controlling when OT4 follows maximally. To that purpose the operation is repeated for each time a different number of pixels.

FIG. 21 shows a more detailed block scheme of a possible embodiment of a detector 50 shown in FIG. 16. At the inputs of the detector the signals OT1 and OT2 are supplied. The element 52 is a control unit adjusting the amplitude of OT2 in such a manner that a (DC) current is present at the output. The control input of the control unit is connected with a DC meter 55. The elements 51 and 53 are low pass filters of which the pass frequency has to be at least the one of the sweep signal. The summation unit 44 is identical to the one shown in FIG. 13 and has the same function. The low pass filters 51 and 53 are switched before the summation unit 44 because it is easier to realize the deduction for low frequencies. A peak detector 54 detects the peak amplitude of the signal at the output of the summation unit 44. The output of the peak detector 54 is on the one hand connected with an input of a sample and hold circuit 56 and on the other hand with a second input (B) of a comparison unit 57, which first input (A) is connected with an output of the sample and hold circuit. The sample and hold circuit also has a reset input (R) and a control input 9 connected with the output of the comparison unit 57.

When the value at the output of the peak detector 54 is larger then the value stored in the sample and hold circuit then at input (B) of the comparison unit, a signal is presented with a larger value than the one the input A (B>A). Under those circumstances the comparison unit supplies a signal with for example logic "1" and consequently the sample and hold circuit 56 is activated in order to pick up the last value supplied by the peak detector 54. If on the other hand B<A then the last value supplied by the peak detector is not picked up. In such a manner the maximum value is thus detected and the number of pixels corresponding with the maximum value is established.

Another embodiment for the automatic determination of the number of pixels uses the conversion calculation member 7 itself and not the PLL and the phase signal generator 34.

The number of pixels per line is adjusted at a random value. That value can be fixed or can be related to other measured picture parameters such as for example the number of picture lines. If the pixels of the first picture are sampled with an erroneous pixel clock K1 then the pixel values x'(j') will not always correspond with the pixel values x(j) supplied by the picture generator, in FIG. 22 those random conditions are represented by RA(j').

The sampling is again carried out, on the same picture but one picture period later, which for the sake of clarity will be considered as being identical to the first sampled picture. That means that the picture does not comprise moving elements during the period of the two samplings. Sampled pixel clock K2 is identical to pixel clock K1, but shows a small phase shift with respect to the latter. Again the random conditions will show up, now represented by RB(j'). Those will however differ from RA(j') besides the case where the original pixel values x(j) in that neighbourhood remain constant. For example when x(3)=x(4)=x(5)=C, then also RA(3)=RB(3)=RA(4)=RB(4)=C. Thereupon the random conditions can occur for other pixels j' than with the sampling with a pixel clock K1.

The sum of the width (expressed in number of pixels) of subsequent good and error zones is a measure for the deviation between the randomly chosen pixel clock and the pixel clock to be recuperated which corresponds with the real number of pixels per line.

In order to determine now that width the conversion calculation member 7 is temporarily switched in a control mode. The pixels obtained by the second sampling are written in a picture memory, and upon reading they are configured to a new picture format, such as shown in FIG. 23. That picture format is converted towards a new format y(i', i). Upon treatment of the equations for h(k,i) the two-dimensional conversion in that specific case the following result is obtained:

$$y(0,0)=0.5\ x'(0,1)+0.5\ x''(0,1)$$

$$y(0,1)=0.25\ x'(0,1)+0.25\ x'(0,2)+0.25\ x''(0,1)+0.25\ x''(0,2)$$

$$y(0,2)=0.5\ x'(0,2)+0.5\ x''(0,2)$$

$$y(0,3)=0.25\ x'(0,2)+0.25\ x'(0,3)+0.25\ x''(0,2)+0.25\ x''(0,3)$$

When now the weight factors remain, but the sign thereof is manipulated for this application and different for the even with respect to the uneven calculations:

1) for the even calculations:

$$y(0,0)=0.5\ x'(0,1)-0.5\ x''(0,1)$$

$$y(0,2)=0.5\ x'(0,2)-0.5\ x''(0,2)$$

2) for the uneven calculations:

$$y(0,1)=-0.25\ x'(0,1)+0.25\ x'(0,2)-0.25\ x''(0,1)+0.25\ x''(0,2)$$

$$y(0,3)=-0.25\ x'(0,2)+0.25\ x'(0,3)-0.25\ x''(0,2)+0.25\ x''(0,3)$$

The even calculations offer a result that is different from 0 when x' differs from the corresponding x", this is only possible within the error zones. The odd calculations offer a result that is different from 0 when the pixel value x changes in the period between two samplings. An error zone (BZ) starts however when an even calculation offers a result which is significantly different from 0, a good zone (GZ) on the other hand can only be established when the uneven calculation offers the result which is significantly different from 0, while the subsequent even calculation offers a result that only lowly differs from 0. It is thus possible that when subsequent pixel values x remain constant, in certain zones of the picture, an error zone between two good zones and one good zone between two error zones can not be recognized. For this reason it is preferable to determine, over the whole picture, a minimum number of pixels be which are situated between two subsequent error zones starting points.

We claim:

1. A method for converting a first picture composed of M ($M \in N$) pixels into a second picture composed of L pixels ($L \in N$, $M \neq L$), wherein the first picture and the second picture have corresponding content, said second picture having a pixel sequence to be displayed with an electronically controlled display provided for pixelwise display, said method comprising:

supplying for each $j^{th}$ ($0 \leq j \leq M-1$) pixel of said first picture a first pixel value x(j);

dividing a first picture surface covered by said first picture into M first picture segments;

dividing a second picture surface covered by said second picture into L second picture segments;

multiplying each $i^{th}$ ($0 \leq i \leq L-1$) second picture segment with a sharpness factor (W) in order to obtain each time a further $i^{th}$ second picture segment;

mapping each further $i^{th}$ second picture segment onto said first picture surface while maintaining the pixel sequence of the second picture, each mapped further $i^{th}$ second picture segment thus forming a further first picture segment within said first picture, the further first picture segments being non overlapping;

identifying within each further first picture segment those first picture segments belonging to the considered further first picture segment in order to form for each further first picture segment a set of k first picture segments including the identified first picture segments for the considered further first picture segment;

assigning to each of the k first picture segments of each set a weight factor h(k,i) indicating each time the surface amount of the considered $k^{th}$ first picture segment contributes to the further $i^{th}$ second picture segment;

applying to each of the first pixel values x(j), a first transfer function component (T), wherein said first transfer function component is not a γ correction function component;

determining each $i^{th}$ second pixel value y(i) by summing the k first pixel values x(j) of the considered set weighed with the assigned weight factor h(k,i);

applying to each of said second pixel values y(i), a second transfer function component (T').

2. A method as claimed in claim 1, wherein said second picture includes fewer pixels than said first picture (M>L) and wherein said second pixel value y(i) is determined by:

$$y(i) = \sum_{n=0}^{s-1} h(k,i)x(k)$$

$$\text{with } k = \left[ \frac{i \cdot M - (W-M)/2}{L} \right] + n \text{ and}$$

$$h(k,i) = \frac{(\min(L \cdot (k+1), M \cdot (i+1) + (W-M)/2) - \max(L \cdot k, M \cdot i - (W-M)/2))}{W}$$

and if $h(k,i)<0$ then $h(k,i)=0$, and wherein $W=wL$ and the sharpness factor $w \neq 1$.

3. A method as claimed in claim 1, wherein said second picture includes more pixels than said first picture (M<L) and wherein said second pixel value y(i) is determined by:

$$y(i) = \sum_{n=0}^{1} h'(k,i)x(k+n)$$

$$\text{with } k = \left[ \frac{i \cdot M - (W-M)/2}{L} \right]$$

and $$h'(k,i) = h(k,i) = \frac{(\min(L \cdot (k+1), M \cdot (i+1) + (W-M)/2) - \max(L \cdot k, M \cdot i - (W-M)/2))}{W}$$

when n=0 and h'(k,i)=1-h(k,i) when n=1, and wherein W=wL and the sharpness factor $w \neq 1$.

4. A method as claimed in claim 1, wherein in said first and second picture, said pixels are linewise aligned and wherein by a one-dimensional conversion for each considered line from said second picture a set of q equations is formed wherein q represents a number of pixels per line and wherein each time a same weight factor is assigned per set of q equations to said pixel values of said first picture belonging to a same line in said first picture.

5. A method as claimed in claim 1, wherein a predetermined transfer function associated with a predetermined transfer pattern is selected as a first transfer function component and an inverse function of a transfer function of said display unit for display of said second picture is selected as second transfer function component.

6. A method as claimed in claim 5, wherein a transfer function of said display unit provided to display said first picture as applied as the first transfer function and the inverse transfer function of said display unit provided to display said second picture is applied as the second transfer function.

7. A method as claimed in claim 1, wherein said second picture is divided in fractions and for each fraction, each time, a dedicated second transfer function component is applied.

8. A method as claimed in claim 1, wherein said first pixel value is derived from a picture information signal including a picture content and a synchronization component, and a phase locked loop (PLL) is used for deriving a pixel clock from a synchronization component, wherein a first phase signal is associated with said picture content component, the first phase signal is compared with a second phase signal belonging to a pixel clock, a phase difference signal being determined therefrom, at the phase difference signal is used as a control signal to adjust a phase of said pixel clock with respect to said first phase signal.

9. A method as claimed in claim 8, wherein a high frequency signal is extracted from said picture content component and said first phase is associated with the high frequency signal.

10. A method as claimed in claim 9, wherein a pulse shaped signal having an intensity is derived from said pixel clock, a pulse width of said pulse shaped signal being equal to the period of said pixel clock, and said intensity being substantially half of an intensity of said pixel clock signal, and the phase difference signal is determined by subtracting said pulse shaped control signal from said first phase signal.

11. A method as claimed in claim 8, wherein said phase of said pixel clock is adjusted with respect to said first phase signal by an adjustment of a transfer amount of said picture synchronization component to the phased locked loop.

12. A method as claimed in claim 8, wherein a variable delay line is controlled by said phase difference signal for adjusting said phase of said pixel clock at an output of said phase locked loop.

13. A method as claimed in claim 8, wherein said first picture is built linewise and said pixel clock is related to a number of pixels per line, and wherein a series of numbers is selected, each number from said series representing each time a possible number of pixels per pixel line of said first picture and wherein for each number of said series, said phase locked loop is each time set with that number and within a predetermined period, said phase of said pixel clock is continuously modified between two predetermined values and wherein it is checked to which extent said phase difference signal follows the modification of said phase of said pixel clock for said predetermined number and for said extent an evolution value being each time determined, and wherein thereafter that number from said series for which the evolution value is the largest is selected, and wherein said phase locked loop being adjusted on said latter number.

14. A method as claimed in claim 8, wherein said first picture is built linewise and said pixel clock is related to the number of pixels per line, wherein a first and a second set of first predetermined pixel values is formed by sampling said pixels with a first pixel clock and a second pixel clock, wherein said second pixel clock is phase-shifted with respect to said first pixel clock, and wherein said first and said second set of first pixel values are reciprocally checked with one another in order to detect a mutual difference in both sets and to verify whether the mutual differences show a periodic character, and wherein by establishing such periodic character said mutual difference being applied to correct the present number of pixels per line.

15. A method as claimed in claim 9, wherein said phase of said pixel clock is adjusted with respect to said first phase signal by an adjustment of a transfer moment of said picture synchronization component to said phase locked loop.

16. A method as claimed in claim 10, wherein said phase of said pixel clock is adjusted with respect to said first phase signal by an adjustment of a transfer moment of said picture synchronization component to said phase locked loop.

17. A method as claimed in claim 9, wherein a variable delay line is controlled by said phase difference signal for adjusting said phase of said pixel clock at an output of said phase locked loop.

18. A method as claimed in claim 10, wherein a variable delay is controlled by said phase difference signal for adjusting said phase of said pixel clock at an output of said phase locked loop.

19. A method as claimed in claim 2, wherein in said first and second picture, said pixels are linewise aligned and wherein by a one-dimensional conversion for each $p^{th}$ line from said second picture, a set of q equations is formed, wherein q represents the number of pixels per line and wherein, each time, a same weight factor is attributed per set of q equations to said pixel values of said first picture belonging to a same line in that first picture.

20. A method as claimed in claim 3, wherein in said first and second picture, said pixels are linewise aligned and wherein by a one-dimensional conversion for each $p^{th}$ line from said second picture, a set of q equations is formed, wherein q represents the number of pixels per line and wherein, each time, a same weight factor is attributed per set of q equations to said pixel values of said first picture belonging to a same line in that first picture.

21. A device for converting a first picture composed of M(M∈N) pixels into a second picture composed of L pixels (L∈N, M≠L), wherein the first and second picture have corresponding content and wherein the pixels of said second picture are arranged according to a pixel sequence, said device comprising:

an input for receiving, for each first picture to be converted, a first series of M first pixel values x(j) (0≤j≤M−1);

dividing means for dividing a first picture surface covered by said first picture into M first picture segments and for dividing a second picture surface covered by said second picture into L second picture segments;

multiplying means for forming each time a further $i^{th}$ second picture segment by multiplying each $i^{th}$ (0≤i≤L−1) second picture segment with a sharpness factor (W);

mapping means for mapping each further $i^{th}$ second picture segment onto said first picture surface while maintaining the pixel sequence of the second picture in order to form, for each mapped further $i^{th}$ second picture segment, a further first picture segment within said first picture, the further first picture segments being non overlapping;

identifying means for identifying, within each further first picture segment, first picture segments belonging to the considered further first picture segment in order to form, for each first picture segment, a set of k first picture segments including the identified first picture segments for the considered further first picture segments;

assigning means for assigning, to each of the k first picture segments of each set, a weight factor h (k,i) indicating each time the surface amount of the considered $k^{th}$ first picture segment contributes to the further $i^{th}$ second picture segment; determining means for summing, for $i^{th}$ second pixel value y(i), the k first pixel values x(j) of the considered set weighed with their assigned weight factor h(k;i); and transfer function application means for applying, to each of said first pixel values x(j), a first transfer function (T), wherein said first transfer function component is not a γ correction function component and for applying, to each of said second pixel values y(i), a second transfer function component (T').

22. A device as claimed in claim 21, wherein said input is provided for receiving a picture information signal including said first pixel values, said picture information signal having a synchronization component including a first phase signal and a picture content, said device further comprising a phase locked loop (PLL) having a signal input for receiving said synchronization component and being provided for deriving a pixel clock signal from said synchronization component, said device further comprising a phase difference determination unit provided for determining a phase difference between said first phase signal and a second phase signal belonging to said pixel clock and for adjusting, under control of said phase difference, said pixel clock with respect to said first phase signal.

* * * * *